United States Patent
Kang

(10) Patent No.: US 7,342,425 B1
(45) Date of Patent: Mar. 11, 2008

(54) METHOD AND APPARATUS FOR A SYMMETRICAL ODD-NUMBER CLOCK DIVIDER

(75) Inventor: Dae Woon Kang, Lafayette, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 215 days.

(21) Appl. No.: 11/221,187

(22) Filed: Sep. 7, 2005

(51) Int. Cl.
*H03B 19/00* (2006.01)

(52) U.S. Cl. ............................ 327/115; 327/117; 377/48
(58) Field of Classification Search ...................... None
See application file for complete search history.

(56) References Cited

U.S. PATENT DOCUMENTS

| | | | |
|---|---|---|---|
| 3,873,815 A | 3/1975 | Summers | |
| 4,348,640 A * | 9/1982 | Clendening | 377/48 |
| 4,366,394 A | 12/1982 | Clendening et al. | |
| 4,715,052 A | 12/1987 | Stambaugh | |
| 5,172,400 A * | 12/1992 | Maemura | 377/116 |
| 5,552,732 A * | 9/1996 | Huang | 327/116 |
| 6,389,095 B1 | 5/2002 | Sun | |
| 7,012,455 B2 * | 3/2006 | Chen | 327/115 |

* cited by examiner

*Primary Examiner*—Kenneth B. Wells
*Assistant Examiner*—An T. Luu

(57) ABSTRACT

A method and apparatus for dividing the frequency of an input clock signal by an odd integer is disclosed. The output of two asymmetrical clock dividers may be combined to produce a divided clock signal having a symmetrical waveform. Finite state machines may be used as asymmetrical clock dividers having desired duty cycles and relative turn-on and turn-off times to produce signals that combine to form a symmetrical divided clock signal. Alternatively, the output of an asymmetrical clock divider may be delayed by one input clock signal half-cycle and combined with the original asymmetrical signal to form a symmetrical divided clock signal.

20 Claims, 4 Drawing Sheets

METHOD AND APPARATUS FOR A SYMMETRICAL ODD-NUMBER CLOCK DIVIDER

TECHNICAL FIELD OF THE INVENTION

The present invention relates generally to clock divider circuits and, more particularly, to clock divider circuits producing a symmetrical waveform that divides the original clock frequency by an odd number.

BACKGROUND OF THE INVENTION

A clock divider circuit is an integral component of radio frequency integrated circuits and microwave circuits, often as part of a phase-locked loop circuit. A circuit designer may need to divide a clock frequency by either an even number or an odd number. An even-number clock divider circuit may be implemented with a T-type flip-flop or other simple circuit. But, implementation of an odd-number clock divider circuit generally requires a more complex circuit.

Some odd-number clock dividers produce an asymmetrical clock signal—i.e., they have a duty cycle other than fifty percent (50%). Furthermore, the design of a clock divider circuit for division by one odd number may often not be easily generated to a design for a different odd number.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1-8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

A method is disclosed that permits implementation of an odd-number clock divider circuit having a symmetrical output waveform. The method may be employed to implement a clock divider circuit dividing an input clock signal by any desired odd number.

Figure 1:
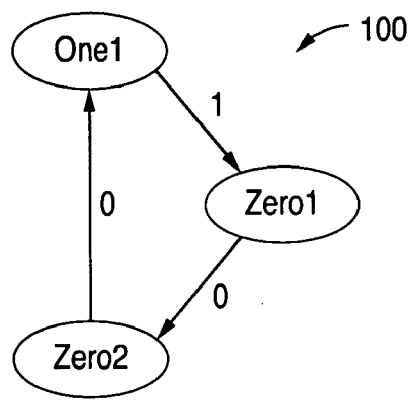
FIG. 1 illustrates a state diagram for a finite state machine for use in an exemplary divide-by-three clock divider according to the present invention.

FIG. 1 illustrates a state diagram 100 for a finite state machine (FSM). The FSM has output 1 while in state One1 for one clock cycle and output 0 while in states Zero1 and Zero2 for two clock cycles. This series of states repeats every three clock cycles. The FSM may also be described by the following state table:

TABLE 1

| Current State ($Q_0$, $Q_1$) | | Next State ($D_0$, $D_1$) | | Output (OUT) |
|---|---|---|---|---|
| One1 | (0 1) | Zero1 | (1 0) | 1 |
| Zero1 | (1 0) | Zero2 | (0 0) | 0 |
| Zero2 | (0 0) | One1 | (0 1) | 0 | and the following logic statements:

$$D_0 = Q_1 \quad (1)$$

$$D_1 = \sim(Q_0 + Q_1) \quad (2)$$

$$OUT = Q_1 \quad (3)$$

where "~" is the NOT operator and "+" is the OR operator.

While the output states are denominated in FIG. 1 and the state table as one and zero, it will be understood that they may also be referred to as true and false or high and low. In a circuit embodying such an FSM, the two states may represent any pair of output voltages, for example +5 volts and 0 volts in a "positive logic" circuit or −5 volts and 0 volts in a "negative logic" circuit.

Figure 2:
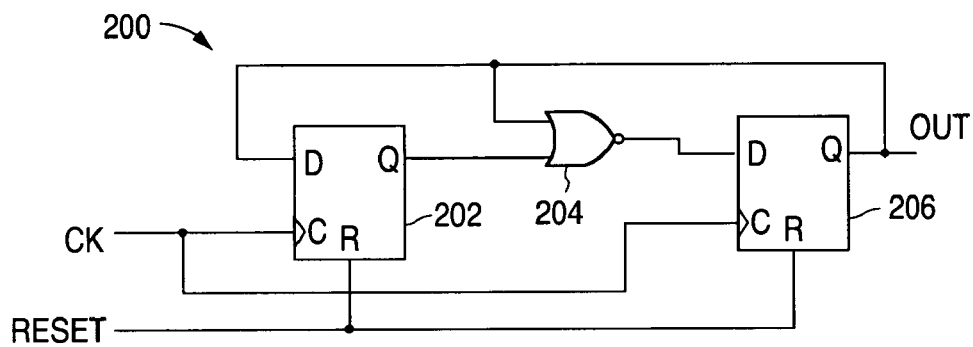
FIG. 2 depicts a circuit embodying a finite state machine having a state diagram as described in FIG. 1.

An exemplary circuit embodying an FSM described by the state diagram of FIG. 1 is depicted in FIG. 2. Asymmetrical clock divider circuit 200 comprises D-type flip-flops 202 and 206, and a NOR gate 204. Following assertion of a reset line RESET, electrically coupled to the reset inputs R of the D-type flip-flops 202 and 206, non-inverting outputs Q of the flip-flops 202 and 206 are false. A data input D of the flip-flop 202 and an input of the NOR gate 204 are electrically coupled to the output Q of the flip-flop 206.

Another input of the NOR gate 204 is electrically coupled to the output Q of the flip-flop 202. Because both inputs of the NOR gate 204 are false, an output of the NOR gate 204 is true, which is electrically coupled to a data input D of the flip-flop 206.

On the first rising edge of a clock line CK, electrically coupled to the clock inputs C of the flip-flops 202 and 206, the true level at the output D of the flip-flop 206 is clocked through to the output Q of the flip-flip 206. The rising edge also clocks the false level at the input D of the flip-flop 202 through to its output Q. The true level at the output Q of the flip-flop 206 causes the output of the NOR gate 204 to go low, which is applied to the data input D of the flip-flop 206.

The second rising edge of the clock line CK clocks the true level from the data input D of the flip-flop 202 through to its output Q. The rising edge also clocks the false level at the output of the NOR gate 204 through to the output Q of the flip-flop 206. The output of the NOR gate 204 remains false because of the true level at the output Q of the flip-flop 202.

The third rising edge of the clock line CK clocks the false level at the input D of the flip-flop 202 through to its output. The rising edge also clocks the false level at the output of the NOR gate 204 through to the output Q of the flip-flop 206. Both the inputs to the NOR gate 204 are again false, and the circuit has returned to the state it was in after the assertion of the reset line RESET.

The output Q of the flip-flop 206 is true for one clock cycle and false for the two succeeding clock cycles and repeats these states every three clock cycles.

Figure 3:
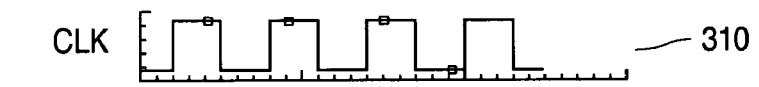
FIG. 3 shows a timing diagram for a divide-by-three clock divider according to the present invention.
Figure 3:
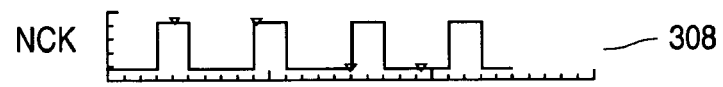
Figure 3:
Figure 3:
Figure 3:
Figure 4:
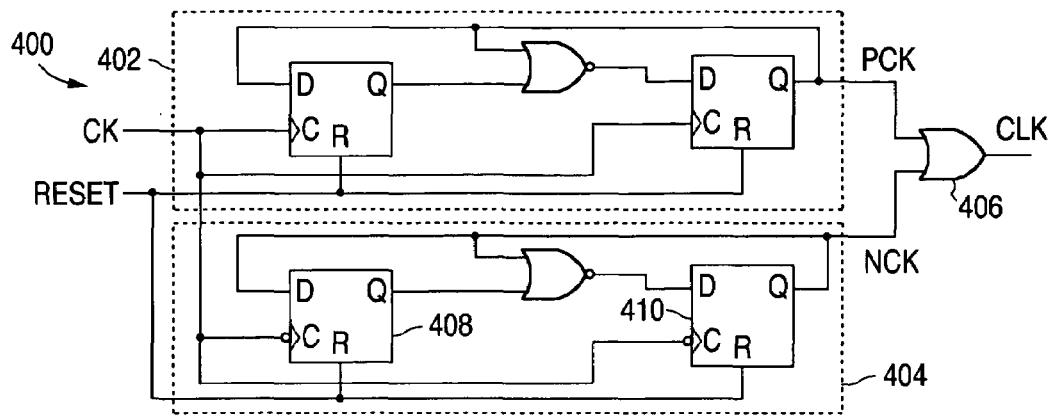
FIG. 4 depicts a schematic circuit diagram for an exemplary divide-by-three clock divider according to the present invention.
Figure 5:
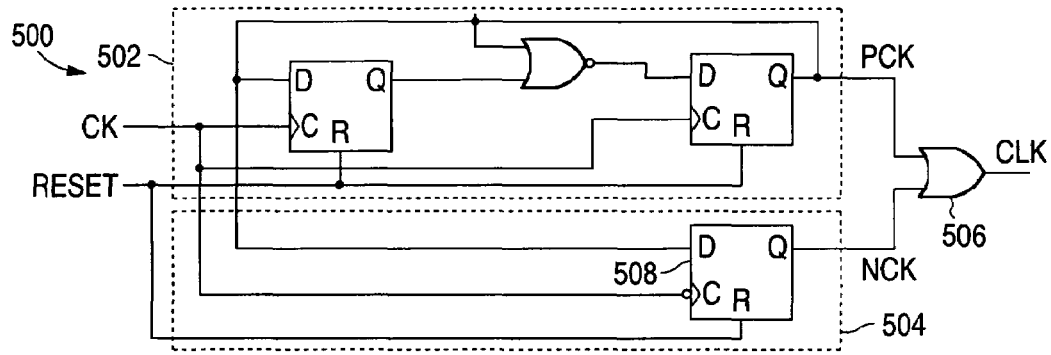
FIG. 5 shows a schematic circuit diagram for another divide-by-three clock divider according to the present invention.

FIG. 3 depicts a timing diagram of the two exemplary embodiments of the present invention shown in FIGS. 4 and 5. Trace 302 shows a reset line RESET asserted to reset a clock divider circuit. In this embodiment, the circuit is used to divide input clock signal CK, shown in trace 304, by 3. Trace 306 shows the signal PCK of a circuit such as that shown in FIG. 2, which is true for one clock cycle and false for two clock cycles. Trace 308 is a similar signal NCK, delayed from the signal PCK by one half-cycle of input clock signal CK. An output divided clock signal CLK, seen in trace 310, is a combination of the signals PCK and NCK. The divided clock signal CLK has a period three times the period of input clock signal CK and a symmetrical duty cycle.

A schematic electrical diagram for one exemplary circuit embodying the present invention is shown in FIG. 4. A clock divider circuit 400 comprises FSMs 402 and 404 and a signal combiner 406, in this embodiment, an OR gate. The FSM 402 is the same asymmetrical clock divider circuit shown in FIG. 2, and produces the signal PCK shown in the timing diagram in FIG. 3.

The FSM 404 is a similar asymmetrical clock divider circuit, with the difference being that flip-flops 408 and 410 have inverting clock inputs. As a result the FSM 404 is clocked by an inverted input clock signal CK, causing it to exhibit the same sequence of states as the FSM 402 delayed by one half-cycle of the input clock signal CK. Thus, the FSM 404 produces the signal NCK shown in FIG. 3. The OR gate 406 combines the signals PCK and NCK of the asymmetrical clock divider circuits 402 and 404 to produce divided clock signal CLK, which has a period three times that of input clock signal CK and a frequency one-third that of input clock signal CK.

Thus, a symmetrical clock divider circuit according to the present invention may be formed from two asymmetrical clock dividers, as shown in FIG. 4. Such a circuit may divide a symmetrical input clock signal having a period $P_C$ into a symmetrical divided clock signal having a period $N*P_C$, where N is an odd integer (N=3 in the circuit of FIG. 4). A first of the two clock dividers goes true to begin a divided clock cycle and remains true for some portion of the first half-cycle of the divided clock signal. The second of the two clock dividers goes true while the first clock divider is still true and remains true until the end of the half-cycle. Both clock dividers remain false through the second half-cycle of the divided clock signal until the first divider goes true again at the beginning of the next divided clock cycle.

Another circuit embodying the present invention is depicted in FIG. 5. In this circuit, a clock divider circuit 500 comprises an FSM 502, a delay circuit 504, and a signal combiner 506. The FSM 502 is, again, the same asymmetrical clock divider circuit shown in FIG. 2. Delay circuit 504 comprises a single D-type flip-flop 508, having its data input D electrically connected to the output PCK of FSM 502. Because the flip-flop 508 has an inverting clock input, electrically coupled to the input clock signal CK, the signal PCK appears at its non-inverting output Q delayed by one half-cycle of the input clock signal CK. Thus, the output of the delay circuit 504 is the signal NCK. The OR gate 506 combines the signals PCK and NCK to produce divided clock signal CLK.

As such, a symmetrical clock divider circuit according to the present invention may also be formed from an asymmetrical clock divider and a delay circuit, as shown in FIG. 5. The asymmetrical clock divider goes true to begin a divided clock cycle and remains true until one half-cycle of the input clock signal before the end of the first half-cycle of the divided clock signal. The delay circuit delays the output of the asymmetrical clock divider by one half-cycle of the input clock signal.

Figure 6:
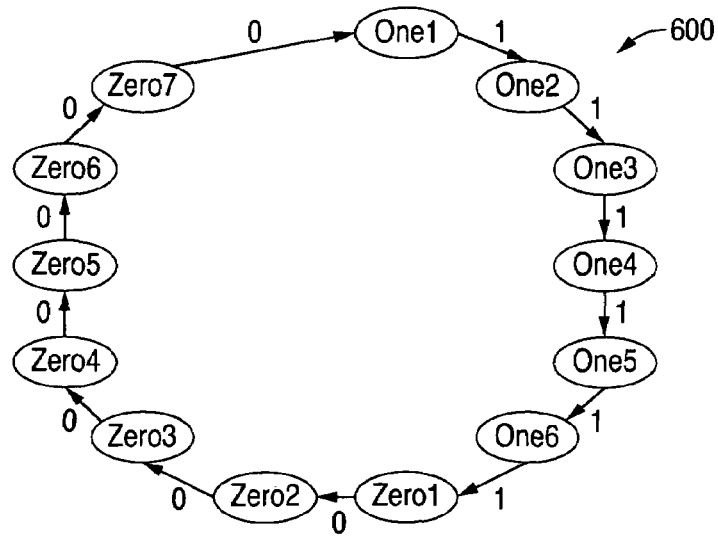
FIG. 6 illustrates a state diagram for a finite state machine for use in an exemplary divide-by-thirteen clock divider according to the present invention.
Figure 7:
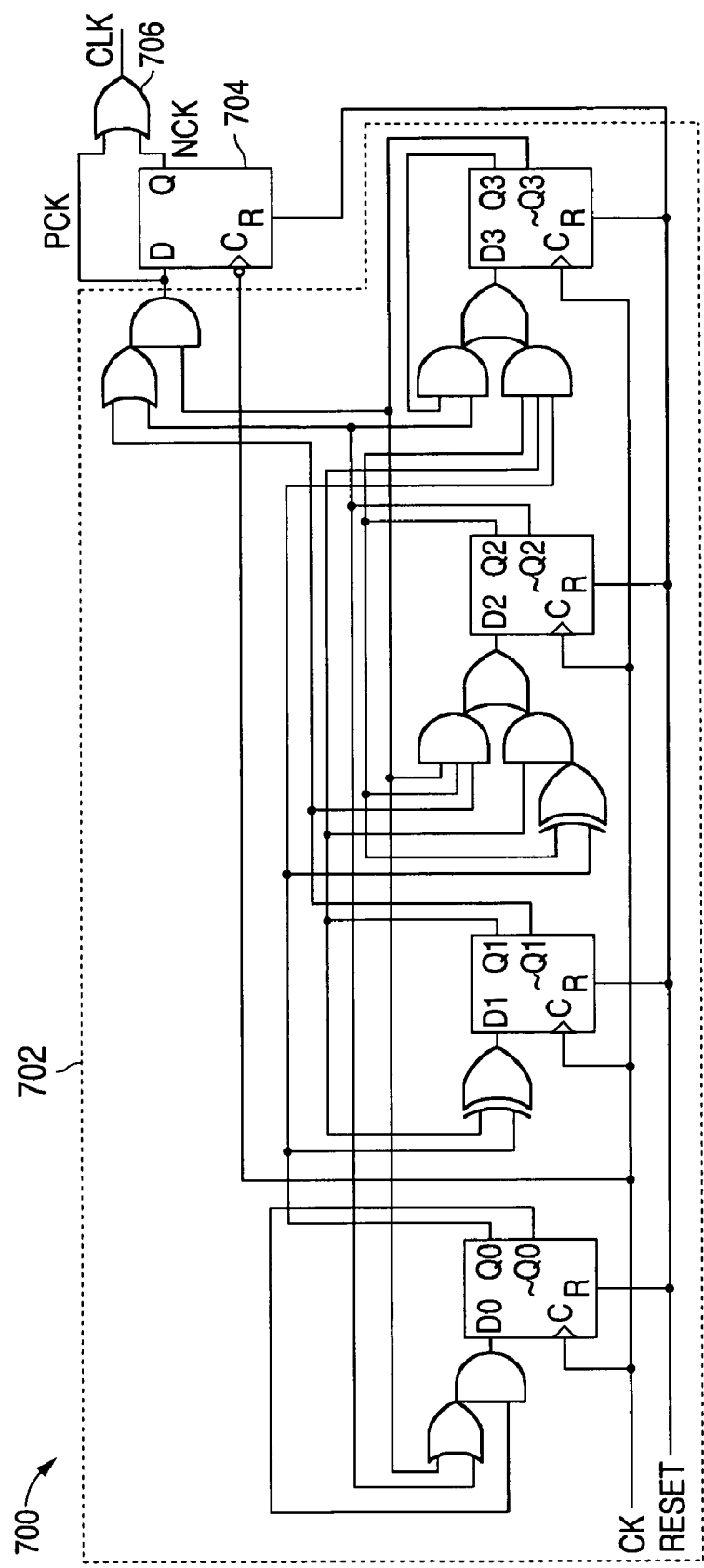
FIG. 7 depicts a schematic circuit diagram for an exemplary divide-by-thirteen clock divider according to the present invention.
Figure 8:
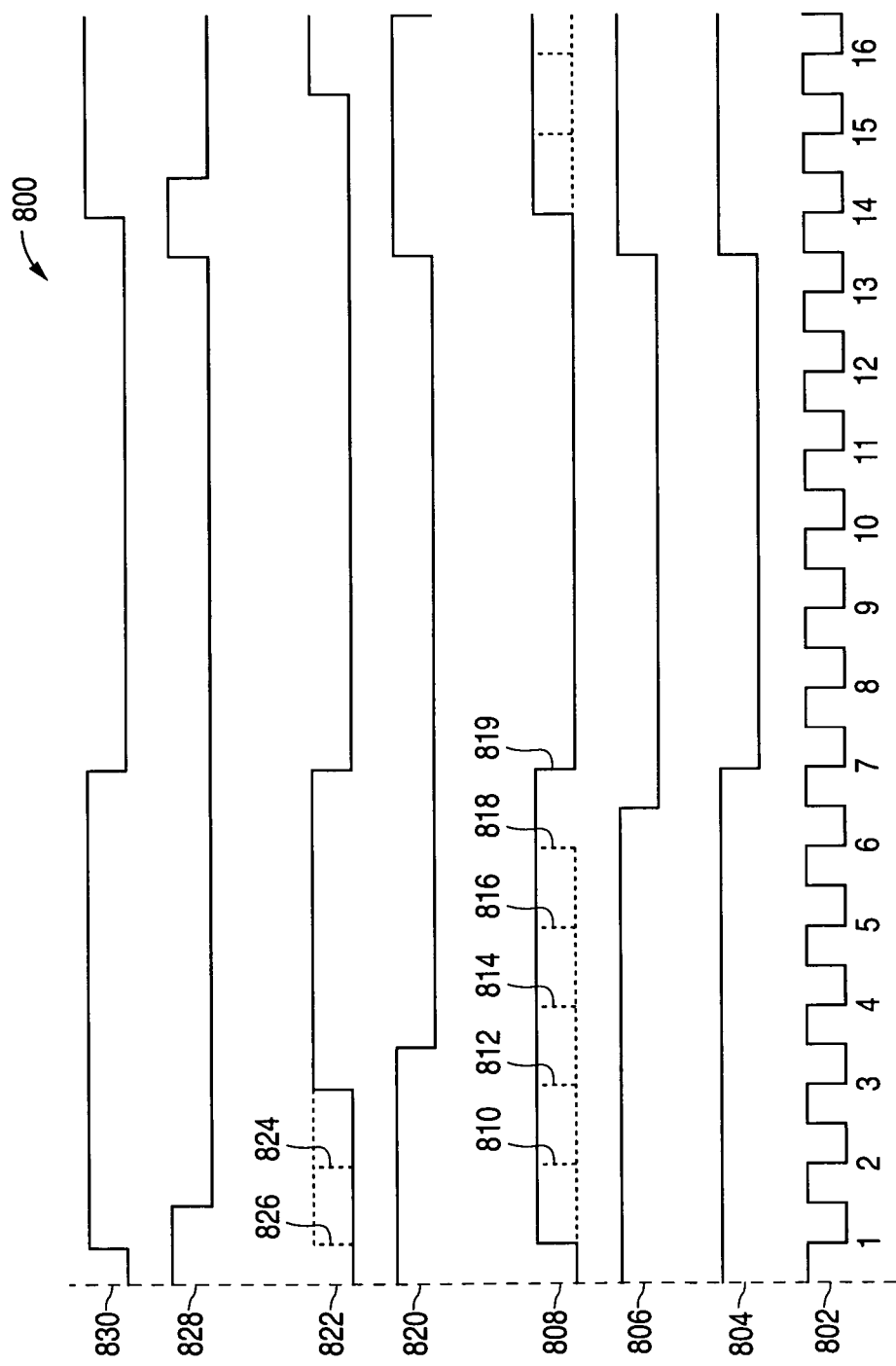
FIG. 8 is a timing diagram for the circuit shown in FIG. 7 and other embodiments of the present invention.

Exemplary embodiments of the present invention that divide an input clock signal by 13 are shown in FIGS. 6-8. FIG. 6 depicts a state diagram 600 of an FSM suitable for such an embodiment. The FSM has output 1 while in states One1 through One6 and output 0 while in states Zero 1 through Zero7. The FSM makes a transition from one state to the next on each clock cycle. Thus, the FSM is an asymmetrical clock divider, dividing its input clock signal by 13.

The FSM may also be described by the following state table:

TABLE 2

| Current State ($Q_3, Q_2, Q_1, Q_0$) | | Next State ($D_3, D_2, D_1, D_0$) | | Output (PCK) |
|---|---|---|---|---|
| One1 | (0 0 0 0) | One2 | (0 0 0 1) | 1 |
| One2 | (0 0 0 1) | One3 | (0 0 1 0) | 1 |
| One3 | (0 0 1 0) | One4 | (0 0 1 1) | 1 |
| One4 | (0 0 1 1) | One5 | (0 1 0 0) | 1 |
| One5 | (0 1 0 0) | One6 | (0 1 0 1) | 1 |
| One6 | (0 1 0 1) | Zero1 | (0 1 1 0) | 1 |
| Zero1 | (0 1 1 0) | Zero2 | (0 1 1 1) | 0 |
| Zero2 | (0 1 1 1) | Zero3 | (1 0 0 0) | 0 |
| Zero3 | (1 0 0 0) | Zero4 | (1 0 0 1) | 0 |
| Zero4 | (1 0 0 1) | Zero5 | (1 0 1 0) | 0 |
| Zero5 | (1 0 1 0) | Zero6 | (1 0 1 1) | 0 |
| Zero6 | (1 0 1 1) | Zero7 | (1 1 0 0) | 0 |
| Zero7 | (1 1 0 0) | One1 | (0 0 0 0) | 0 | and the following logic statements:

$$D_3 = Q_3 \cdot {\sim}Q_2 + Q_2 \cdot Q_1 \cdot Q_0 \tag{4}$$

$$D_2 = {\sim}Q_3 \cdot Q_2 \cdot {\sim}Q_1 + (Q_2 {\,}^{\wedge} Q_0) \cdot Q_1 \tag{5}$$

$$D_1 = Q_1 \hat{} Q_0 \quad (6)$$

$$D_0 = (\sim Q_3 + \sim Q_2) \cdot \sim Q_0 \quad (7)$$

$$PCK = \sim Q_3 \cdot (\sim Q_2 + \sim Q_1) \quad (8)$$

where "·" is the AND operator, "~" is the NOT operator, "+" is the OR operator, and "^" is the XOR operator.

FIG. 7 shows a symmetrical divide-by-thirteen clock divider 700 according to the present invention, comprising an asymmetrical divide-by-thirteen clock divider 702, a delay circuit 704, and a signal combiner 706. Similar to the operation of the symmetrical divide-by-three clock divider shown in FIG. 5, an output PCK of the clock divider 702 goes true for 6 cycles of input clock signal CK. The signal NCK at the output of the delay circuit 704 is the signal PCK, delayed by one half-cycle of the input clock signal CK. The OR gate 706 combines the signals PCK and NCK to form divided clock signal CLK, which has a symmetric waveform and a period 13 times longer than input clock signal CK.

Timing diagrams for several embodiments of the present invention are illustrated in FIG. 8. With reference to the embodiment shown in FIG. 7, the input clock signal CK is shown in trace 802 and the divided clock signal CLK in trace 804. Trace 806 depicts the signal PCK and the solid line in trace 808 depicts the signal NCK.

The dotted lines in trace 808 illustrate alternative embodiments that may be formed using the two FSMs 402 and 404, as discussed with regard to FIG. 4. The FSM 402 may be designed with output signal 806. The FSM 404 may then be designed with output signal as shown by the solid line in trace 808. Alternatively, the FSM 404 may be designed to go true at any of half-cycle edges 810 through 818 and stay true until half-cycle edge 819. The combination of asymmetrical clock divider waveform 806 and any of the alternative waveforms 808 produces symmetrical divided clock signal waveform 804.

In another alternative embodiment, the FSM 820 may be an asymmetric clock divider with the output waveform shown in trace 820. Such a circuit is true for 3 cycles and false for 10 cycles of input clock signal 802. Trace 822 shows three alternative waveforms for the FSM 404. The solid line illustrates a signal that goes true 2½ input clock cycles after the FSM 402 and remains true for 4 clock cycles. Dashed lines 824 and 826 represent signals that go true 1½ and ½ input clock cycles, respectively, after the FSM 402 and remain true for 5 and 6 clock cycles, respectively.

In the limiting case shown in traces 828 and 830, the FSM 402 is designed to be true for one input clock cycle and false for 12 cycles. Correspondingly, the FSM 404 goes true on the first half-cycle and remains true for 6 full cycles. The combination of any of the pairs of waveforms (806/808, 820/822, or 828/830) produces the symmetrical waveform of trace 804.

Thus, as discussed with regard to FIG. 4, a symmetrical clock divider circuit according to the present invention may from two asymmetrical clock dividers. A first of the two clock dividers goes true to begin a divided clock cycle and remains true for some portion of the first half-cycle of the divided clock signal. The second of the two clock dividers goes true while the first clock divider is still true and remains true until the end of the half-cycle. Both clock dividers remain false through the second half-cycle of the divided clock signal until the first divider goes true again at the beginning of the next divided clock cycle.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in an electronic circuit, a method of dividing the frequency of an input clock signal having a period $P_C$ by an odd positive integer N, comprising the steps of:
   producing a first signal by clocking a first plurality of D-type flip-flops with the input clock signal, wherein the first signal is true for a time substantially equal to $P_C*M_P$ and false for time a time substantially equal to $P_C*(N-M_P)$, where $M_P$ is a positive integer less than $(N-1)/2$;
   producing a second signal by clocking a second plurality of D-type flip-flops with the input clock signal, wherein the second signal is true for a time substantially equal to $P_C*M_N$ and false for a time substantially equal to $P_C*(N-M_N)$, where $M_N$ is a positive integer less than $(N+1)/2$ and greater than $((N+1)/2)-(M_P+1)$; and
   combining the first signal and second signal to produce a divided clock signal having period $P_C*N$.

2. The method of claim 1, wherein the second signal becomes true D half-cycles of the input clock signal after the first signal becomes true, where D is $N-(2*M_N)$.

3. The method of claim 1, wherein the step of producing the first signal comprises the step of dividing the input clock signal.

4. The method of claim 1, wherein the step of producing the second signal comprises the step of inverting the input clock signal.

5. The method of claim 4, wherein the step of producing the second signal further comprises the step of dividing the inverted input clock signal.

6. The method of claim 1, wherein the step of producing the first signal comprises the step of:
   combining data outputs of the first plurality of D-type flip-flops to produce the first signal.

7. The method of claim 6, wherein the step of producing the second signal comprises the step of:
   combining data outputs of the second plurality of D-type flip-flops to produce the second signal.

8. The method of claim 1, wherein the step of clocking the second plurality of D-type flip-flops comprises the step of inverting the input clock signal.

9. For use in an electronic circuit, a clock divider circuit for dividing the frequency of an input clock signal having a period $P_C$ by an odd positive integer N, comprising:
   a clock signal input;
   a first divider circuit, coupled to the clock signal input, capable of producing at an output a first signal, wherein the first signal is true for a time substantially equal to $P_C*M_P$ and false for a time substantially equal to $P_C*(N-M_P)$, where $M_P$ is a positive integer less than $(N-1)/2$, wherein said first divider circuit comprises a first plurality of D-type flip-flops;
   a second divider circuit coupled to the clock signal input, capable of producing at an output a second signal, wherein the second signal is true for a time substantially equal to $P_C*M_N$ and false for a time substantially equal to $P_C*(N-M_N)$, where $M_N$ is a positive integer less than $(N+1)/2$ and greater than $((N+1)/2)-(M_P+1)$, wherein said second divider circuit comprises a second plurality of D-type flip-flops; and a divided clock output coupled to the outputs of the first and second divider circuits, wherein the signal at the divided clock output is a divided clock signal having period $P_C*N$.

10. The clock divider circuit of claim 9, wherein the second signal becomes true D half-cycles of the input clock signal after the first signal becomes true, where D is $N-(2*M_N)$.

11. The clock divider circuit of claim 9, wherein the output of the first divider circuit is coupled to a first input of an OR gate, the output of the second divider circuit is coupled to a second input of the OR gate, and the output of the OR gate is coupled to the divided clock output.

12. The clock divider circuit of claim 9, wherein the first plurality of D-type flip-flops have their clock inputs coupled to the clock signal input, wherein at least one data output of the first plurality of flip-flops is coupled to the output of the first divider circuit.

13. The clock divider circuit of claim 12, wherein the second divider circuit comprises a second plurality of D-type flip-flops having have their clock inputs coupled to the clock signal input, wherein at least one data output of the second plurality of flip-flops is coupled to the output of the second divider circuit.

14. The clock divider circuit of claim 13, wherein at least one clock input of the second plurality of D-type flip-flops is coupled to an inverted clock signal input.

15. The clock divider circuit of claim 9, further comprising a circuit reset input, coupled to the first and second divider circuits.

16. The clock divider circuit of claim 9, wherein the second divider circuit is coupled to an inverted clock signal input.

17. For use in an electronic circuit, a phase locked loop circuit, comprising:
 a clock divider circuit for dividing the frequency of an input clock signal having a period $P_C$ by an odd positive integer N, comprising:
 a clock signal input;
 a first divider circuit, coupled to the clock signal input, capable of producing at an output a first signal, wherein the first signal is true for a time substantially equal to $P_C*M_P$ and false for a time substantially equal to $P_C*(N-M_P)$, where $M_P$ is a positive integer less than $(N-1)/2$, wherein said first divider circuit comprises a first plurality of D-type flip-flops;
 a second divider circuit coupled to the clock signal input, capable of producing at an output a second signal, wherein the second signal is true for a time substantially equal to $P_C*M_N$ and false for a time substantially equal to $P_C*(N-M_N)$, where $M_N$ is a positive integer less than $(N+1)/2$ and greater than $((N+1)/2)-(M_P+1)$, wherein said second divider circuit comprises a second plurality of D-type flip-flops; and
 a divided clock output coupled to the outputs of the first and second divider circuits, wherein the signal at the divided clock output is a divided clock signal having period $P_C*N$.

18. The phase locked loop circuit as claimed in claim 17, wherein the second signal of the second divider circuit becomes true D half-cycles of the input clock signal after the first signal becomes true, where D is $N-(2*M_N)$.

19. The phase locked loop circuit as claimed in claim 17, wherein the output of the first divider circuit is coupled to a first input of an OR gate, the output of the second divider circuit is coupled to a second input of the OR gate, and the output of the OR gate is coupled to the divided clock output.

20. The phase locked loop circuit as claimed in claim 17, wherein
 the first plurality of D-type flip-flops have their clock inputs coupled to the clock signal input, wherein at least one data output of the first plurality of flip-flops is coupled to the output of the first divider circuit; and wherein
 the second plurality of D-type flip-flops have their clock inputs coupled to the clock signal input, wherein at least one data output of the second plurality of flip-flops is coupled to the output of the second divider circuit.

* * * * *

UNITED STATES PATENT AND TRADEMARK OFFICE
CERTIFICATE OF CORRECTION

PATENT NO. : 7,342,425 B1
APPLICATION NO. : 11/221187
DATED : March 11, 2008
INVENTOR(S) : Dae Woon Kang Page 1 of 1

It is certified that error appears in the above-identified patent and that said Letters Patent is hereby corrected as shown below:

Column 1, line 25, delete "generated" and replace with --generalized--;

Column 3, line 8, delete "output" and replace with --input--;

Column 7, claim 13, line 20, delete "second divider circuit comprises a";

Column 7, claim 13, line 21, delete "having".

Signed and Sealed this

Fifteenth Day of July, 2008

JON W. DUDAS
*Director of the United States Patent and Trademark Office*